United States Patent [19]
Contiero et al.

[11] Patent Number: 5,837,554
[45] Date of Patent: Nov. 17, 1998

[54] INTEGRATED CIRCUIT WITH EPROM CELLS

[75] Inventors: Claudio Contiero, Milan; Tiziana Cavioni; Stefano Manzini, both of Novara, all of Italy

[73] Assignee: SGS-Thomson Microelectronics S.r.l., Agrate Brianza, Italy

[21] Appl. No.: 477,304

[22] Filed: Jun. 7, 1995

Related U.S. Application Data

[62] Division of Ser. No. 358,152, Dec. 15, 1994.

[30] Foreign Application Priority Data

Dec. 15, 1993 [EP] European Pat. Off. .............. 93830505

[51] Int. Cl.⁶ ................................................. H01L 21/8247
[52] U.S. Cl. .................................. 437/43; 437/59; 437/74
[58] Field of Search ................................. 437/43, 56, 57, 437/58, 59, 74, 63, 64; 148/DIG. 85, DIG. 86

[56] References Cited

U.S. PATENT DOCUMENTS

| | | | |
|---|---|---|---|
| 4,586,238 | 5/1986 | Yatsuda et al. | 437/48 |
| 5,166,082 | 11/1992 | Nakamura et al. | 437/59 |
| 5,198,374 | 3/1993 | Kato | 437/43 |

FOREIGN PATENT DOCUMENTS

| | | |
|---|---|---|
| 0 267 882 A1 | 5/1988 | European Pat. Off. . |
| 0 403 449 A2 | 12/1990 | European Pat. Off. . |
| 1-140759 | 1/1989 | Japan . |
| 3-105971 | 2/1991 | Japan . |

OTHER PUBLICATIONS

Ohzone et al., "An 8K×8 Bit Static MOS RAM Fabricated by n–MOS/n–Well CMOS Technology," *IEEE Journal of Solid–State Circuits*, SC–15(5):pp. 854–861, Oct. 1980.

Primary Examiner—Chandra Chaudhari
Attorney, Agent, or Firm—David V. Carlson; Harry K. Ahn; Seed and Berry LLP

[57] ABSTRACT

An integrated circuit structure is disclosed wherein an EPROM cell has an active area formed by the same operations as are carried out to form a P region intended to contain an N-channel MOS transistor, source and drain regions formed by the same operations as are carried out to form the source and drain regions of said transistor, a control electrode consisting of an N+ region formed by the same operations as are carried out to form deep regions intended to contact buried N+ regions, and a floating gate electrode consisting of a layer of conductive material formed by the same operations as are carried out to form the gate electrodes of the MOS transistors in the integrated circuit. The EPROM cell can, therefore, be formed in a mixed integrated circuit with no need for purposely added processing steps.

10 Claims, 4 Drawing Sheets

INTEGRATED CIRCUIT WITH EPROM CELLS

CROSS-REFERENCE TO RELATED APPLICATION

This application is a division of U.S. patent application Ser. No. 08/358,152, filed Dec. 15, 1994.

TECHNICAL FIELD

This invention relates to integrated circuits, and particularly to a monolithic integrated circuit including, at least one electrically programmable read-only non-volatile memory (EPROM, EEPROM) cell.

BACKGROUND OF THE INVENTION

Many industrial applications require complex electronic circuits to perform multiple functions which range from the processing of signals, whether in the analog, or the digital form, to the amplification of such signals and the generation of power signals for controlling and powering electric loads, e.g. motors, relays, lamps, etc. Certain applications involve data storage functions as well.

A trend toward ever more compact circuits has led to the development of processes for forming integrated circuits comprised of a large variety of electronic components, which may have even radically different structural and functional features, on a common substrate of semiconductor material. Thus, monolithic integrated structures comprising CMOS (Complementary Metal Oxide Semiconductor) circuits have been developed essentially for processing digital signals, as have bipolar circuits essentially for amplifying analog, signals, DMOS (Diffused Metal Oxide Semiconductor) power components, and bipolar power components for generating and controlling high voltages and large currents. For any data storage functions, however, the prior art provides external devices purposely designed and constructed to perform such functions. It is a widespread opinion among the designers of semiconductor devices that the manufacturing processes of storage devices are too fundamentally different from the manufacturing processes of so-called mixed integrated circuits of the type described above, and that while memory cells may be integrated, at least in theory, with mixed integrated circuits, this would involve in practice the addition of a number of processing steps to the already complicated manufacturing process, thereby making the process a highly critical one and the end product generally unreliable.

SUMMARY OF THE INVENTION

It is the object of this invention to provide for a monolithic integrated circuit structure comprising at least one programmable read-only memory (EPROM or EEPROM) cell to be formed by a manufacturing process of mixed integrated circuits with no processing steps specifically added or with the addition of few non-critical processing steps.

This object is achieved by an integrated circuit structure wherein the memory cell has its active area formed by the same operations as are carried out to form a P region for containing, an N-channel MOS transistor, its source and drain regions formed by the same operations as are carried out to form the source and drain regions of the transistor, its control electrode provided by an N+ region formed by the same operations as are carried out to form deep regions intended for contacting buried N+ regions, and a floating gate electrode comprising a conductive material layer formed by the same operations as are carried out to form the gate electrodes of the MOS transistors in the integrated circuit.

The invention and its advantages can be more clearly understood by having reference to the following detailed description of various embodiments thereof, given by way of example and not of limitation in connection with the accompanying drawings.

DETAILED DESCRIPTION OF THE INVENTION

Figure 1:
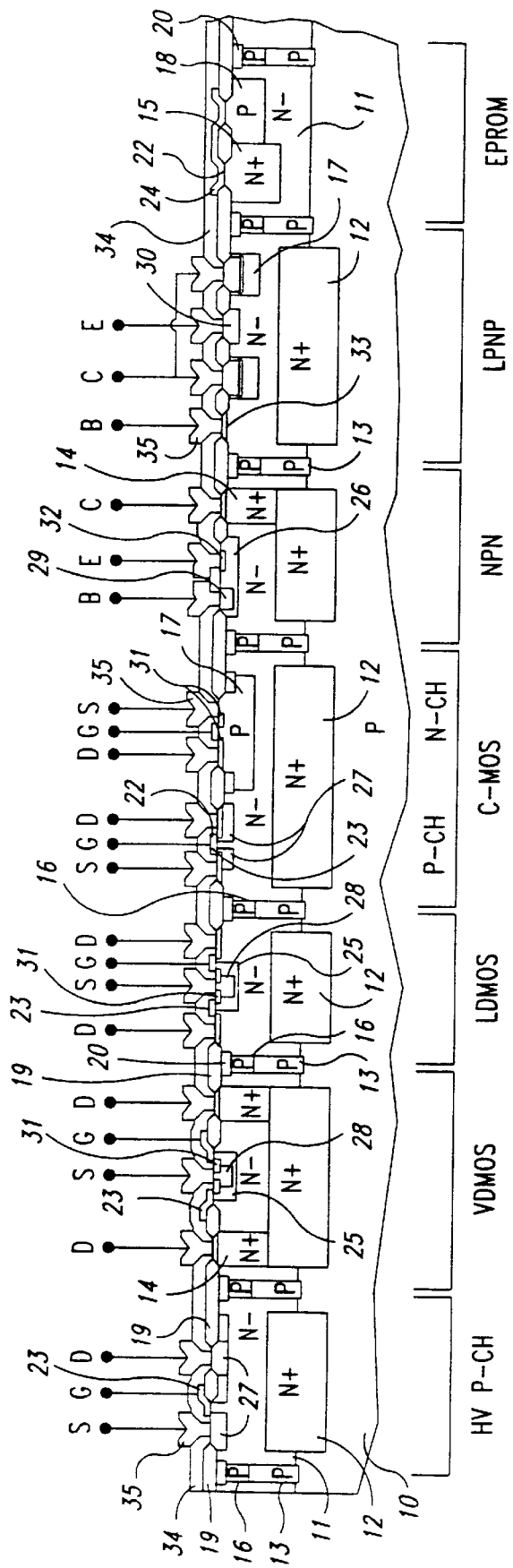
FIG. 1 is a sectional view showing schematically a structure according to the invention, with an EPROM cell and some components obtained by a manufacturing process of a mixed integrated circuit.

Shown in FIG. 1 are some of the principal components of a mixed integrated circuit. These are identified by the following abbreviations:

HVP-CH=a high-voltage P-channel MOS transistor,

VDMOS=a vertical conduction power transistor,

LDMOS=a horizontal conduction power MOS transistor,

CMOS=a pair of complementary MOS transistors, namely a P-channel (P-CH) transistor and an N-channel (N-CH) transistor, NPN=a vertical conduction bipolar transistor of the NPN type, LPNP=a lateral, i.e. horizontal conduction, bipolar transistor of the PNP type, and EPROM=an electrically programmable read-only memory cell.

In the drawing figure, the electrodes of the various components are identified as follows:

S=Source,

D=Drain,

G=Gate,

E=Emitter,

B=Base,

C=Collector.

The main process steps for forming the structure of FIG. 1 are well known in the art and are briefly summarized herein below with reference to FIG. 1.

1. Impurities of the N type are implanted in some selected areas and impurities of the P type are implanted in some other selected areas of a substrate 10, of monocrystalline silicon of the P type.

2. A layer of N− silicon 11, is formed by epitaxial growth at a high temperature over the substrate 10; during this step, the impurities of the N and P types implanted during the preceding step will diffuse to form buried N+ regions 12, and deep isolation P regions 13.

3. Deep N+ regions 14, are formed by implantation and subsequent diffusion which extend from the front surface of the structure into the N-epitaxial layer 11 to contact with some of the N+ buried regions 12, namely the drain region of the VDMOS transistor and buried collector region of the NPN transistor; during the same step, the region 15 is formed which constitutes the control electrode of the EPROM cell.

4. Formed by implantation followed by diffusion, are intermediate isolation regions 16, the so-called P-well region 17, for containing, the N-channel transistor of the CMOS pair, the collector region of the lateral bipolar LPNP transistor 17', and the region 18, which is intended to contain the active area of the EPROM cell.

5. The surface areas to be isolated from one another are defined using a LOCOS technique of local oxide growth.

6. Impurities of the P and N types are implanted in selected areas of the epitaxial layer 11.

7. Silicon dioxide regions 19, are grown at a high temperature by the LOCOS technique to isolate the previously defined areas from one another; during this step, P regions 20, are formed by diffusion of the impurities implanted during the preceding step, which completes the isolation regions by delimiting portions of the N-epitaxial layer 11 therein.

8. Thin layers, indicated at 22, of silicon dioxide are formed over those areas which define the channels of the MOS transistors, including the EPROM cell channel, and the isolation layer between the floating gate 24 and the control electrode 15 of the EPROM cell is also formed.

9. Impurities of the P type are implanted in the channel areas of the P-channel transistors of the CMOS pairs to bring down their conduction thresholds.

10. Formed from a previously deposited layer of polycrystalline silicon are the gate electrodes, indicated at 23, of the MOS transistors, the floating gate electrode, indicated at 24, of the EPROM cell, and interconnection paths, not shown, for connecting together the various components.

11. Formed, as by implantation followed by diffusion, are additional so-called body regions of the P type, indicated at 25, of the VDMOS and LDMOS transistors, as well as the base region, indicated at 26, of the vertical NPN bipolar transistor.

12. The source and drain P+ regions, indicated at 27, of the transistor HVP-CH and the P-channel transistor in the CMOS pair, P+ body surface enhancement regions 28 of the VDMOS and LDMOS transistors, base contact region 29 of the NPN bipolar transistor, and emitter region 30 of the LPNP lateral bipolar transistor are formed.

13. The N+ source regions, indicated at 31, of the VDMOS and LDMOS transistors, source and drain regions 31 of the transistor N-CH in the CMOS pair and the EPROM cell, N+ emitter region, indicated at 32, of the NPN transistor, and N+ base contact region 33 of the LPNP transistor are formed.

14. An insulating layer 34 is formed through which apertures are opened in selected areas for the ohmic contact of the various components.

15. Formed from a metallic layer previously deposited over the insulating layer 34 are ohmic contacts 35 in the selected contact areas, including that for the control electrode 15 of the EPROM cell, and electric connection paths, not shown, between components of the circuit.

Figure 2:
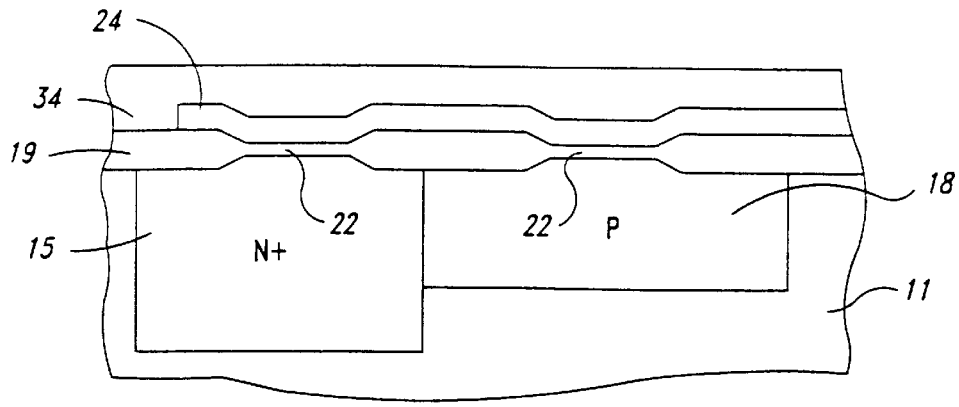
FIG. 2 is an enlarged sectional view of the EPROM cell shown in FIG. 1.
Figure 3:
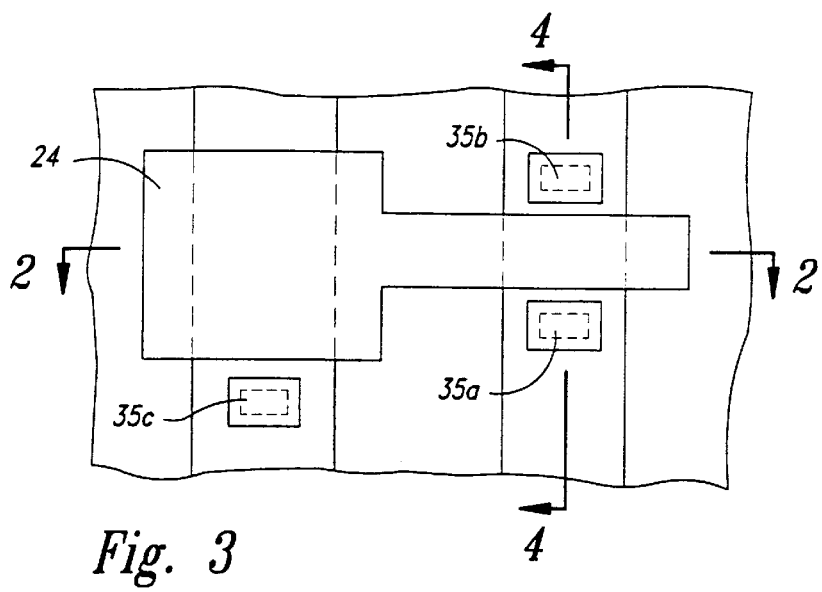
FIG. 3 is a plan view of the EPROM cell in FIG. 2.
Figure 4:
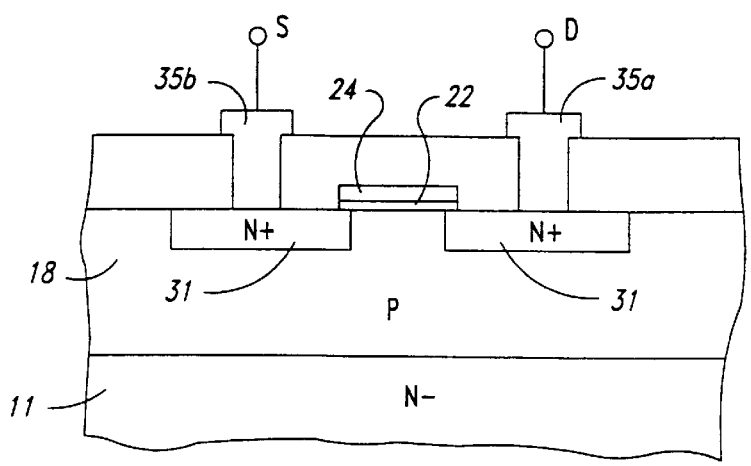
FIG. 4 is a sectional view of the EPROM cell taken along line IV—IV in FIG. 3.

As can be seen, in particular from FIGS. 2, 3 and 4, the EPROM cell yielded by the process just described is a cell with a single layer of polycrystalline silicon 24 and a control gate or control electrode 15 diffused through the epitaxial layer 11. The floating gate 24, formed from the polysilicon layer, is coupled capacitively to both the control electrode 15 and the active area between the source and drain regions 31, i.e. to the channel of the cell. The cell terminals comprise ohmic contacts for the source and drain 35a, 35b and control 35c electrodes (FIGS. 3 and 4). The cell is conventionally programmed by applying a high voltage (10 to 15 V) to the drain and control electrodes relative to the source electrode and the channel region, to thereby establish a flow of electric charges (hot electrons) from the channel to the floating gate 24 through the gate oxide 22. The floating gate 24, once charged, will alter the conduction threshold of the MOS transistor of the cell, that is the minimum source-drain voltage which admits an appreciable current flow through the channel. There are two possible threshold levels of the transistor, corresponding to a state of absence or presence of charges on the floating gate, which define the 0 or 1 logic levels of the cell. The cell state is detected, i.e., the memory cell read, by applying a low voltage (4 to 5 V) to the drain and control electrodes relative to the source and measuring the current that flows through the channel. Since the gate 24 is fully isolated electrically, its charge state will not change during normal read operations, that is the cell will behave as a read-only memory (ROM) cell. Where necessary, this cell type can be erased, as is known, by exposure to ultraviolet (UV) radiation. For this purpose, a transparent window to this radiation would have to be provided in the structure containing the integrated circuit with the EPROM cell.

The number of EPROM cells formed will obviously depend on individual circuit requirements for storage. The cells may be arrayed across a single N+ region constituting the control electrode common to all the cells, or be arranged otherwise across the various side-by-side N+ regions to form a matrix of cells.

Figure 5:
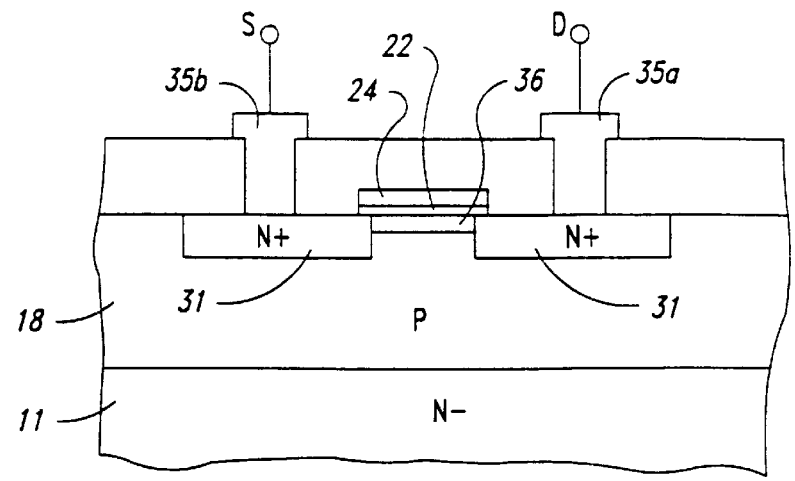
FIGS. 5 and 6 are sectional views similar to FIG. 4 but showing alternative embodiments of the EPROM cell of FIG. 4.
Figure 6:
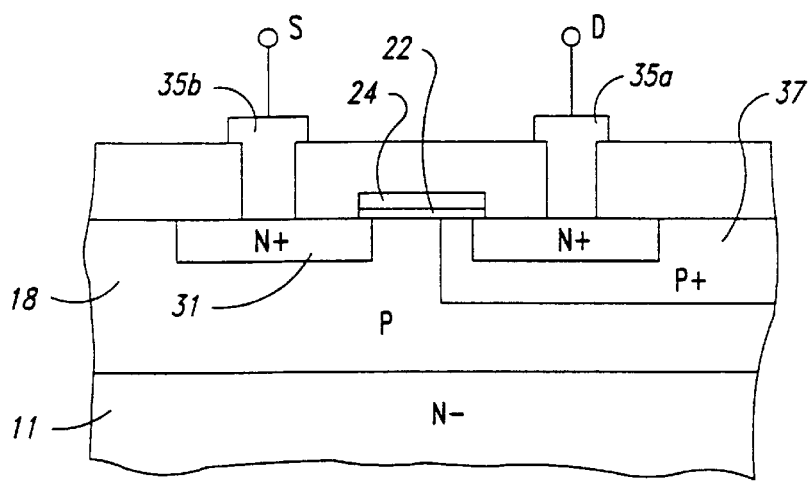

It is a recognized fact that the programming speed of an EPROM cell is substantially affected by the concentration of impurities in the channel. When the channel is formed from a region with a low impurity concentration, a special surface enhancement operation is resorted to. In the instance of the inventive structure, this enhancement is advantageously obtained by utilizing the same process step wherein P impurities are implanted in the channels of the P-channel transistors of the CMOS pairs (Step 9 of the process described hereinabove), or utilizing the same process step as provided for forming the body regions of the VDMOS and LDMOS transistors (Step 11 of the process described hereinabove). Cross-sectional views of the cell structure in accordance with these two alternative embodiments, are shown in FIGS. 5 and 6, where the enhanced region according to the first alternative embodiment is indicated at 36, and that according to the second alternative embodiment is indicated at 37.

As can be seen in the embodiments of the invention described above, the EPROM cells may be formed in the structure itself of the mixed integrated circuit with no need for additional operations.

Figure 7:
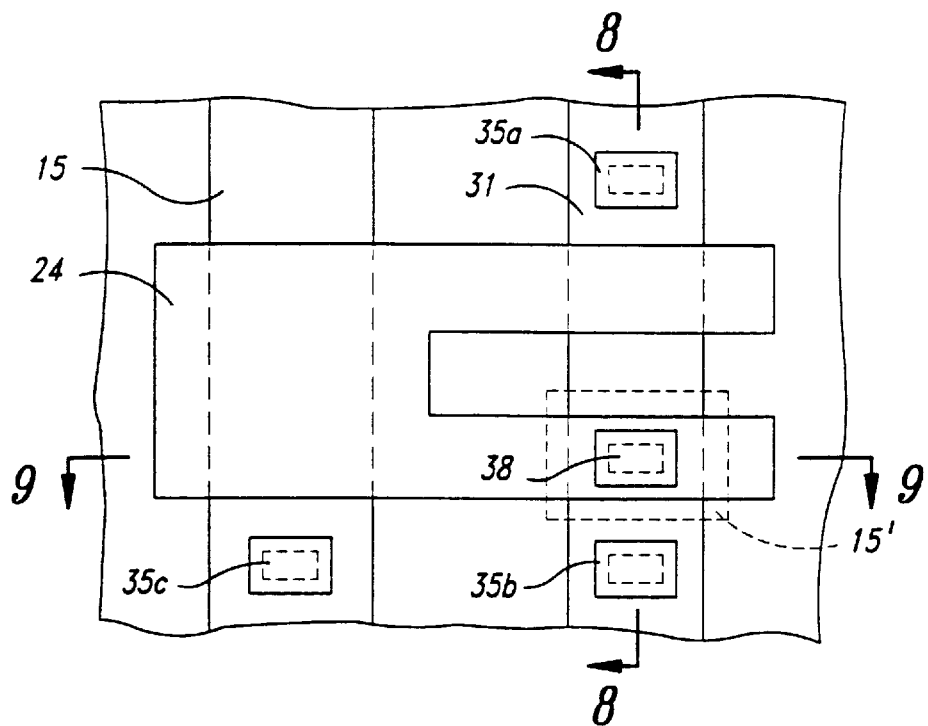
FIG. 7 is a plan view of an EEPROM cell according to another embodiment of the invention.

In another embodiment of the invention, a type of EPROM called electrically erasable programmable read-only memory (EEPROM) cells may also be formed in the same structure, alternatively or in combination with the EPROM cells. In this case, an N+ region, shown at 15, in FIGS. 7 to 9, should be formed which may be termed an injection region and would be isolated from the control electrode region 15. That region 15' is preferably formed in the active area of the cell by the same operation as detailed under 3. of the description of the manufacturing process previously provided whereby N+ deep regions are formed. Then, by a single additional operation, a depressed area 38 is formed in the insulating layer 22 which extends across the injection region 15'. That layer of reduced thickness can be obtained by opening a small aperture through the thin layer 22 of silicon dioxide during the gate isolation layer forming step and growing a very thin (8–10 nm as against the 50–60 nm of the gate isolator) layer of silicon dioxide over the exposed surface of the injection region. A flow of charges will occur in a known manner by tunneling effect through that layer as the cell electrodes are suitably polarized.

Figure 8:
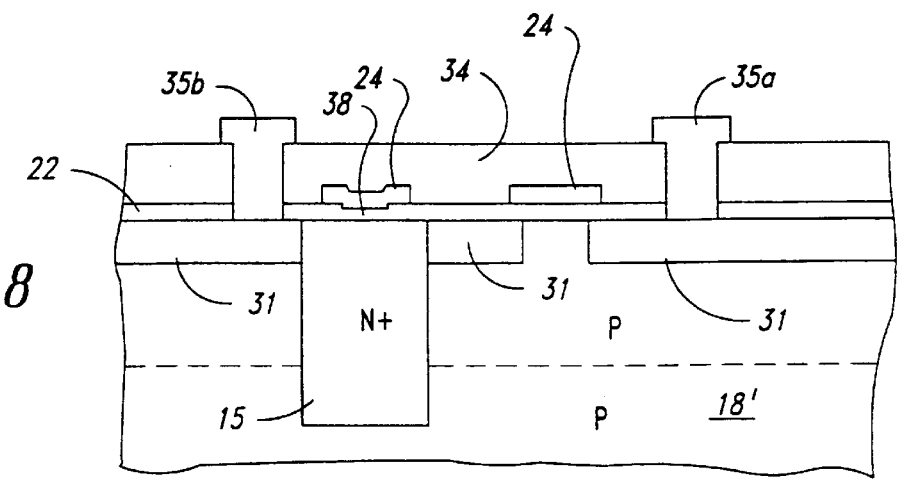
FIGS. 8 and 9 are sectional views of the EEPROM cell in FIG. 7 taken along lines VIII—VIII and IX—IX, respectively.
Figure 9:
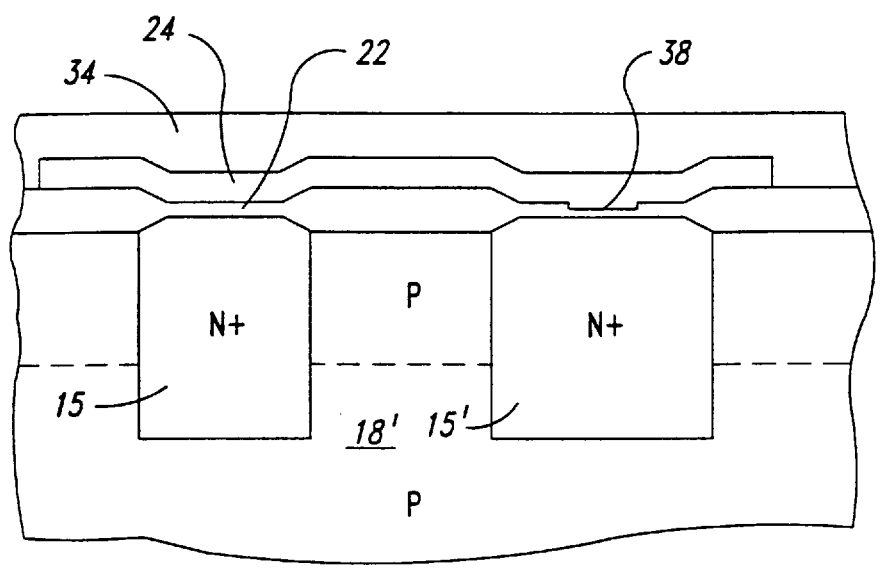

A method of isolating the injection region 15' from the control electrode region 15 would consist of forming a P region adapted to contain both said regions 15 and 15'. Advantageously, this containing region, shown at 18' in FIGS. 8 and 9, is formed by two P regions similar to those provided in Steps 2., 3 and 4 of the process described above for forming the isolation regions.

This isolation method may also be practiced where EPROM cells are to be isolated.

In another alternative embodiment of the invention, particularly where the structure of the integrated circuit includes components that require strongly doped but relatively thin N+ regions, i.e. regions significantly less deep than the contact regions 14 of the buried regions 12, the region which functions as control electrode and the injection region are advantageously formed of two such relatively thin N+ regions. In this way, cells can be obtained which are more compact in size than the cells according to the first embodiment of the invention.

We claim:

1. A method of forming an electrically programmable read-only memory cell within a semiconductor structure having a top surface, the method comprising the steps of:

forming an epitaxial layer overlying a substrate, the epitaxial layer being of the opposite conductivity type as the substrate;

forming an isolation region extending from the top surface into the epitaxial layer, the isolation region being of the opposite conductivity type as the epitaxial layer;

forming a control electrode region extending from the top surface into the epitaxial layer, the control electrode region being of the same conductivity type as the epitaxial layer;

forming two thin regions extending from the top surface into a portion of the isolation region, the two thin regions being of the same conductivity type as the control electrode region and defining the source and the drain regions of the memory cell;

forming an insulating layer overlying the isolation region, the control electrode region and a selected portion of the region between the two thin regions; and forming a floating gate region overlying the insulating layer and extending over the selected portion of the region between the two thin regions and over a selected portion, of the control electrode region.

2. The method according to claim 1, further including the step of:

enhancing the selected portion of the region between the two thin regions with higher concentration of impurities of the same type as the isolation region.

3. The method according to claim 1, further comprising the step of:

enhancing a selected portion of the isolation region with a higher concentration of impurities of the same type as the isolation region wherein one of the two thin regions is formed within the enhanced portion and the enhanced portion includes a portion of the selected region between the two thin regions.

4. The method according to claim 1, further comprising the step of:

forming an injection region extending from the top surface into the epitaxial layer wherein the formed floating gate region extends over the injection region and the formed insulating layer insulates the injection region from the overlying floating gate region.

5. A method of forming an electrically programmable read-only memory cell within a semiconductor structure, the method comprising the steps of:

forming an isolation region extending from a top surface of the semiconductor structure into a substrate of the semiconductor structure, the isolation region being of the opposite conductivity type as the substrate;

forming a control electrode region extending from the top surface into the substrate, the control electrode region being of the same conductivity type as the substrate;

forming two thin regions in the isolation region, the two thin regions extending from the top surface into the isolation region, and being of the same conductivity type as the control electrode region, the two thin regions defining source and drain regions of the memory cell, and an active area therebetween;

forming an insulating layer overlying the isolation region, the control electrode region and the active area; and forming a floating gate region overlying the insulating layer, and extending over the active area and the control electrode region.

6. The method according to claim 5, further comprising the step of:

enhancing the active area with a higher concentration of impurities of the same type as the isolation region.

7. The method according to claim 5 further comprising the step of:

forming an enhanced region with a higher concentration of impurities of the same type as the isolation region, wherein the enhanced region encloses one of the two thin regions and a portion of the active area.

8. The method according to claim 5, further comprising the step of:

forming an injection region extending from the top surface into the substrate, wherein the formed floating gate region extends over the injection region and the formed insulating layer insulates the injection region from the overlying floating gate region.

9. The method according to claim 5 where in the control electrode region and the two thin regions are of N+ type, and the isolation region is of P type.

10. The method according to claim 5 where in the substrate is an epitaxial layer, and the method further comprises the step of:

forming a the epitaxial layer over the substrate of the semiconductor material, the epitaxial layer being of the opposite conductivity type as the isolation region.

* * * * *